(12) United States Patent
Calpito et al.

(10) Patent No.: US 7,188,759 B2
(45) Date of Patent: Mar. 13, 2007

(54) METHODS FOR FORMING CONDUCTIVE BUMPS AND WIRE LOOPS

(75) Inventors: Dodgie Reigh Manzano Calpito, Singapore (SG); Stephen Babinetz, Lansdale, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 11/222,300

(22) Filed: Sep. 8, 2005

(65) Prior Publication Data

US 2006/0054665 A1 Mar. 16, 2006

Related U.S. Application Data

(60) Provisional application No. 60/607,888, filed on Sep. 8, 2004.

(51) Int. Cl.
*B23K 31/02* (2006.01)

(52) U.S. Cl. .................. 228/180.5; 228/4.5; 228/110.1

(58) Field of Classification Search ............. 228/180.5, 228/4.5
See application file for complete search history.

(56) References Cited

U.S. PATENT DOCUMENTS

| | | | |
|---|---|---|---|
| 5,205,463 A | 4/1993 | Holdgrafer et al. | |
| 6,062,462 A | 5/2000 | Gillotti et al. | |
| 6,156,990 A | 12/2000 | Ellis | |
| 6,244,499 B1 * | 6/2001 | Tsai et al. | 228/180.5 |
| 6,270,000 B1 * | 8/2001 | Nishiura | 228/180.5 |
| 6,715,666 B2 * | 4/2004 | Imai et al. | 228/180.5 |
| 7,025,247 B2 * | 4/2006 | Mii et al. | 228/180.5 |
| 2003/0155405 A1 * | 8/2003 | Takahashi | 228/180.5 |
| 2004/0152292 A1 | 8/2004 | Babinetz et al. | |
| 2004/0164127 A1 * | 8/2004 | Mii et al. | 228/180.5 |

* cited by examiner

*Primary Examiner*—Lynne R. Edmondson
*Assistant Examiner*—Michael Aboagye
(74) *Attorney, Agent, or Firm*—Christopher M. Spletzer, Sr.

(57) ABSTRACT

A method of forming a conductive bump is provided. The method includes depositing a conductive bump on a bonding location using a bonding tool such that a junction exists between (1) a length of wire extending at least partially within the bonding tool and (2) the deposited conductive bump. The method also includes moving the bonding tool to contact the conductive bump such that a location of the junction is moved with respect to the bonding location.

20 Claims, 7 Drawing Sheets

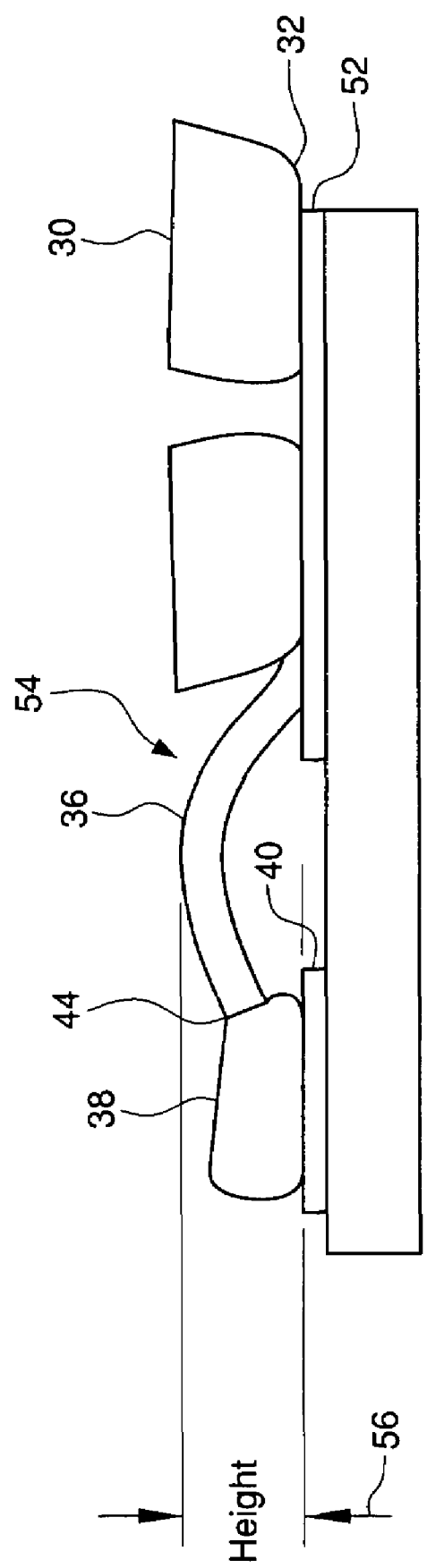

METHODS FOR FORMING CONDUCTIVE BUMPS AND WIRE LOOPS

RELATED APPLICATION

This application is related to and claims priority from U.S. Provisional Application No. 60/607,888, filed Sep. 8, 2004, which is incorporated herein by reference in its entirety.

FIELD OF THE INVENTION

The present invention relates to wire bonding, and more particularly, to methods of forming conductive bumps and wire loops.

BACKGROUND OF THE INVENTION

In the electronics industry, conductive wire is used in a variety of devices, such as semiconductor devices for example, to connect portions of the device. Exemplary materials for wire bonding are gold, aluminum, copper and silver. A wire bond is formed by attaching a length of wire between two contact/bonding locations (e.g., a first location being on a semiconductor die, and the second location being on a substrate supporting the die). In order to form the attachment, various devices are used to sever and bond the wire ends to the contact locations. Known wire bonding apparatuses include thermocompression (T/C), thermosonic (T/S) or ultrasonic (U/S) devices. The resulting length of bonded wire is typically curved along its length in a generally parabolic or elliptical configuration and is, therefore, referred to as a wire "loop".

Two known techniques for bonding a wire to a semiconductor device are ball bonding and wedge bonding. Ball bonding is generally the preferred technique, particularly in the semiconductor industry in which more than 90 percent of all semiconductor devices are manufactured using ball bonding.

Referring to FIGS. 1A through 1G, there is shown schematically a process of forming a wire loop on a substrate using a known ball bonding technique. The exemplary bonding apparatus includes capillary 10 carried by a bond head (not shown) for movement with respect to substrate 12. In FIGS. 1A through 1G, capillary 10 is illustrated as moving as indicated by the arrows. Although the bonding process is described herein as being accomplished by moving capillary 10, it should be understood that the desired relative movement between capillary 10 and substrate 12 could also be achieved by moving substrate 12, or by a combined movement of both capillary 10 and substrate 12. Capillary 10 defines a central passage in which fine wire 14 is received such that wire 14 is fed from working tip 16 of capillary 10.

The bonding apparatus also includes clamp 18, which is carried by the bond head adjacent capillary 10 for preventing relative movement between capillary 10 and wire 14. Referring to FIG. 1A, a terminal end portion of wire 14 extending beyond working tip 16 of capillary 10 is formed into substantially spherical ball 20. Ball bonding apparatuses typically include an electronic flame-off (EFO) wand (not shown) that, when fired, generates a spark that melts the extending end portion of the wire. As the molten end portion of the wire solidifies, surface tension forms the end portion into a substantially spherical configuration, which is sometimes referred to in the art as a "free-air ball." Ball 20 is bonded to substrate 12 (i.e., a bonding location of substrate 12 such as a contact pad of substrate 12) by the bonding apparatus as described below.

As shown in FIG. 1B, with clamp 18 open, capillary 10 is directed downwardly until ball 20 touches contact 22 on substrate 12. Compressive force is then applied to ball 20 by working tip 16 of capillary 10 while heat and vibration is applied by the bonding apparatus. The combined effects of the compressive force, heat and vibration flattens the ball 20 and bonds ball 20 to contact 22 through interfacial interaction between ball 20 and contact 22.

Referring to FIG. 1C, capillary 10 is then moved vertically away from contact 22 with clamp 18 in an opened condition such that wire 14 is fed from working tip 16 of capillary 10. As shown in FIG. 1D, a horizontal component is then added to the movement of capillary 10 to direct capillary 10, and wire 14 is fed from capillary 10, to a second bond location on substrate 12. Capillary 10 is then moved into contact with substrate 12 at the second bond location where compressive force, heat and vibration is again applied to bond wire 14 to substrate 12 at the second location, thus forming wire loop 24.

Referring to FIGS. 1F and 1G, capillary 10 is then moved by the bonding apparatus a short distance away from the second location on substrate 12 to feed a terminal end portion of wire 14 from capillary 10, which will form the free-air ball for the next wire loop. With clamp 18 closed, capillary 10 is then moved further away from substrate 12 such that wire 14 is separated from substrate 12 as shown in FIG. 1G.

Referring to FIG. 2, completed wire loop 24 is shown in greater detail. As shown, the above-described bonding process results in a flattening of ball 20 at the first bond location on contact 22. The capillary of ball bonding apparatuses typically includes chamfered surfaces at the working tip such that substantially conical portion 26 of ball 20 is formed. As described above, capillary 10 of the prior ball bonding apparatus is moved vertically into contact with the first bond location. The movement of the capillary remains vertical (i.e., perpendicular to the bond plane at first contact location) as ball 20 is bonded to contact 22. As a result, wire 14 of wire loop 24 is located at the top of the ball 20 and extends, initially, upwardly from the top of the ball 20.

Ball bonding apparatuses are also used to form flat-top bumps, also known as "flip-chip connections." Similar to wire bonding, a ball is formed at the end of the wire and the capillary is moved along a vertical pathway to flatten the ball against a contact surface while heat and vibration are applied. Unlike a wire looping process, however, the capillary is raised from the bonded ball with the clamp closed to separate the wire from the ball. The separation results in a peaked surface at the top of the bonded ball that includes the junction between the ball and the wire. The peaked surface is then subjecting to a "coining" process in which force is applied to flatten the peaked surface to create a smooth top.

It would be desirable to provide a ball bonding process for forming a wire loop having a reduced height compared to wire loops formed by prior ball bonding processes and to provide for a desirably shaped bump without the use of a coining process.

SUMMARY OF THE INVENTION

According to an exemplary embodiment of the present invention, a method of forming a conductive bump is provided. The method includes depositing a conductive bump on a bonding location using a bonding tool such that a junction exists between (1) a length of wire extending at least partially within the bonding tool and (2) the deposited conductive bump. The method also includes moving the bonding tool to contact the conductive bump such that a location of the junction is moved with respect to the bonding location.

According to another exemplary embodiment of the present invention, a method of forming a wire loop extending between a first bonding location and a second bonding location is provided. The method includes depositing a conductive bump on a first bonding location using a bonding tool such that a junction exists between (1) a length of wire extending at least partially within the bonding tool and (2) the deposited conductive bump. The method also includes moving the bonding tool to contact the conductive bump such that a location of the junction is moved with respect to the bonding location. The method also includes moving the bonding tool towards a second bonding location while paying out wire through the bonding tool. The method also includes forming a wire bond at the second bonding location, such that a wire loop extends between the first bonding location and the second bonding location.

BRIEF DESCRIPTION OF THE DRAWINGS

The invention is best understood from the following detailed description when read in connection with the accompanying drawing; it being understood, however, that this invention is not limited to the precise arrangements and instrumentalities shown. It is emphasized that, according to common practice, the various features of the drawing are not to scale. On the contrary, the dimensions of the various features are arbitrarily expanded or reduced for clarity. Included in the drawing are the following figures:

FIG. 4 illustrates a wire loop according to an exemplary embodiment of the present invention formed using the ball bonding process of FIGS. 3A through 3C.

DETAILED DESCRIPTION OF THE DRAWINGS

Figure 1A:
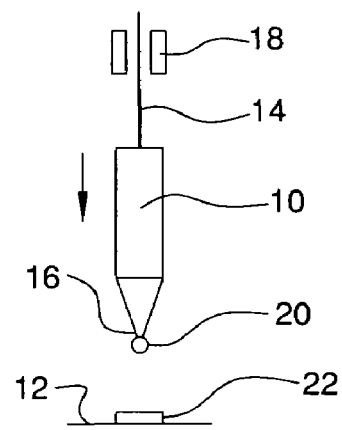
FIGS. 1A through 1G are schematic illustrations of a prior art ball bonding process.
Figure 1B:
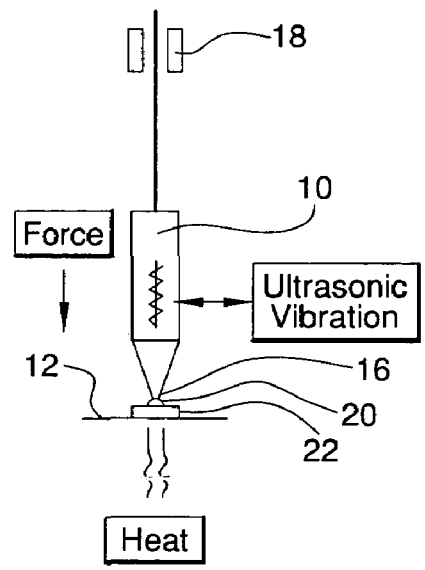
Figure 1C:
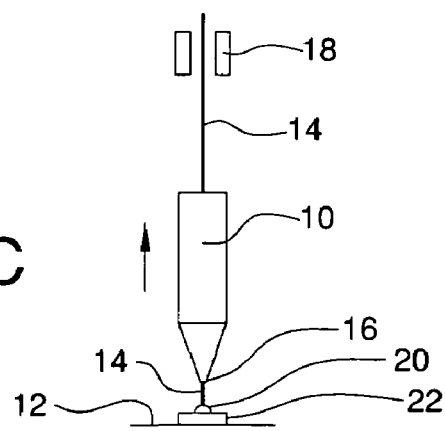
Figure 1D:
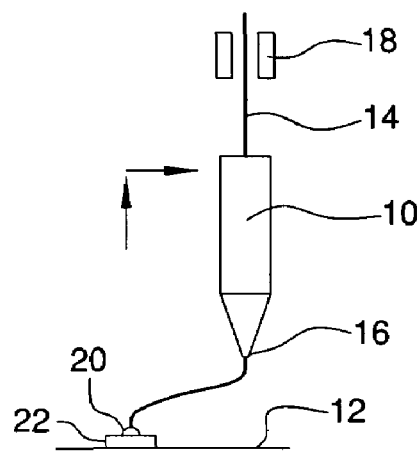
Figure 1E:
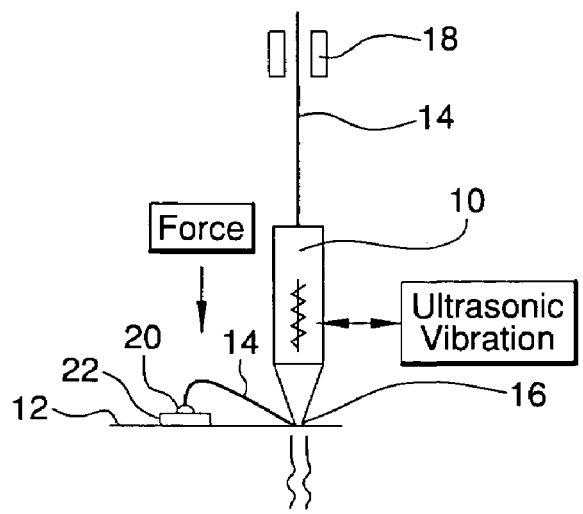
Figure 1F:
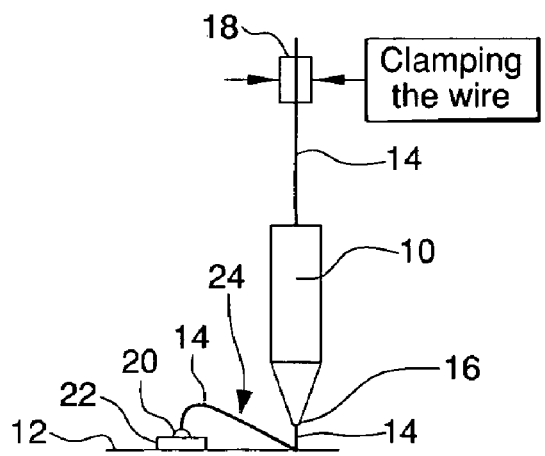
Figure 1G:
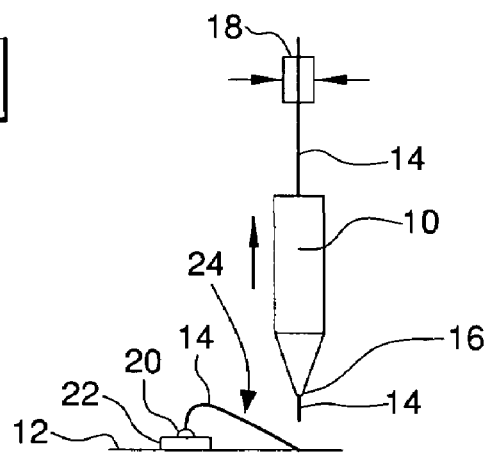
Figure 2:
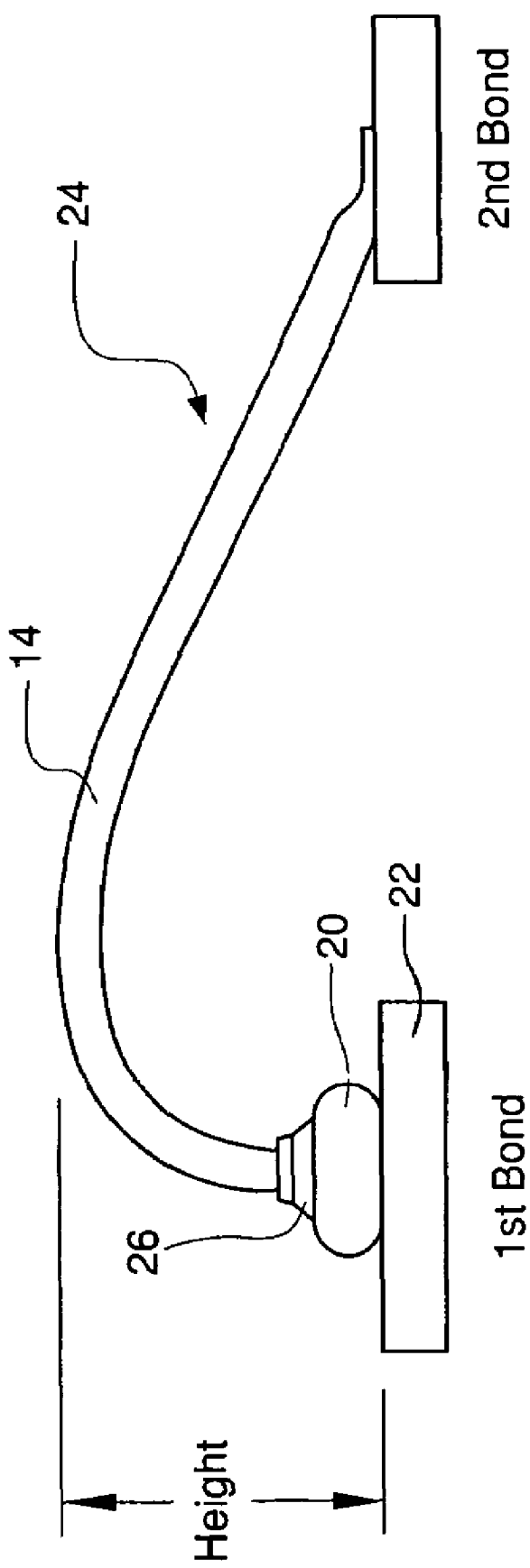
FIG. 2 is an illustration of a prior art wire loop formed by the ball bonding process of FIGS. 1A through 1G.

U.S. Pat. Nos. 5,205,463, 6,062,462, and 6,156,990, as well as U.S. patent Publication No. 2004/0152292, relate to wire bonding technology, and are herein incorporated by reference in their entirety.

As used herein, the term "bonding location" refers to any of a number of locations used to deposit (e.g., ball bond) a conductive bump, or to bond an end of a wire loop. For example, a bonding location may be a conductive region of a substrate (e.g., a contact pad of the substrate, a terminal of the substrate, a conductive trace of the substrate, etc.). Other exemplary bonding locations include conductive regions of a semiconductor device (e.g., a contact pad of a semiconductor die, etc.).

According to certain exemplary embodiments of the present invention, a ball bonding process is provided for bonding a wire ball to a bonding location (e.g., a conductive region of a substrate, a conductive region of an integrated circuit device, etc.). A ball bonding apparatus includes a bonding tool (e.g., a capillary) defining a central passage for receiving a length of wire such that the wire extends from a working tip of the capillary. A substantially spherical ball is formed from an end portion of the wire, preferably by directing a spark to the wire from an EFO wand.

The capillary is directed towards the bonding location until the ball touches the surface of the bonding location. The capillary is then moved by the ball bump apparatus along a downwardly oblique pathway with respect to the surface of the bonding location such that a rolling motion is imparted to the ball by a horizontal component of the capillary movement as the vertical component of the capillary movement flattens the ball. The rolling motion imparted to the ball as it is bonded to the surface of the bonding location relocates the junction between the wire and the ball from the top of the ball to one side of the ball.

According to certain exemplary embodiments of the present invention, the ball bonding apparatus is used to form a wire loop. As the ball is being rolled by the obliquely moving capillary, the vertical component of the capillary motion is increased until the capillary is moved along a substantially vertical path with respect to a first bonding location. The ball is rolled and bonded to the first bonding location while the clamp is held in an opened condition allowing relative movement between the wire and the capillary. For example, heat and vibration may be applied by the ball bonding apparatus to facilitate bonding between the ball and the first bonding location. After the ball has been bonded to the first bonding location, the capillary is directed away from the first bonding location to a second bonding location while the clamp is held opened to feed wire from the capillary. The wire is then bonded to the second bonding location by the capillary to form a wire loop.

According to certain exemplary embodiments of the present invention, a ball bonding apparatus is used to form a conductive bump on a bonding location. The capillary of the ball bump apparatus includes a working tip having a face angle that is equal to approximately zero degrees. The capillary is moved towards the bonding location until the wire ball touches the surface of the bonding location. The capillary is then moved along a downwardly oblique path with respect to the bonding location such that a horizontal component of the motion imparts a rolling motion to the ball while a vertical component flattens the ball. The rolling motion imparted to the ball relocates the junction between the wire and the ball from the top of the ball to one side of the ball.

In contrast to the certain other exemplary embodiments of the present invention (e.g., certain of the methods of forming wire loops), the clamp of the ball bonding apparatus is closed during the rolling of the ball such that the diameter of the wire is reduced at the junction between the wire and the ball. The reduction in the diameter of the wire weakens the wire at the junction, such that movement of the capillary away from the bonded ball with the clamp in an opened condition results in separation between the wire and the bonded ball bump as a short length of wire is fed from the working tip of the capillary.

Figure 3A:
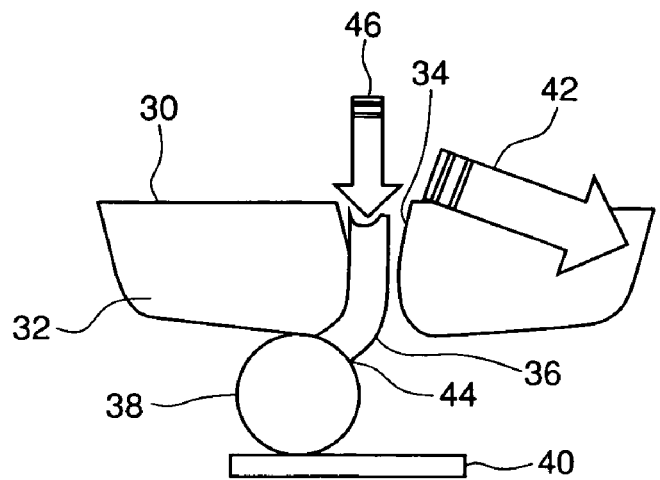
FIGS. 3A through 3C are schematic illustrations of a ball bonding process according to an exemplary embodiment of the present invention.
Figure 3B:
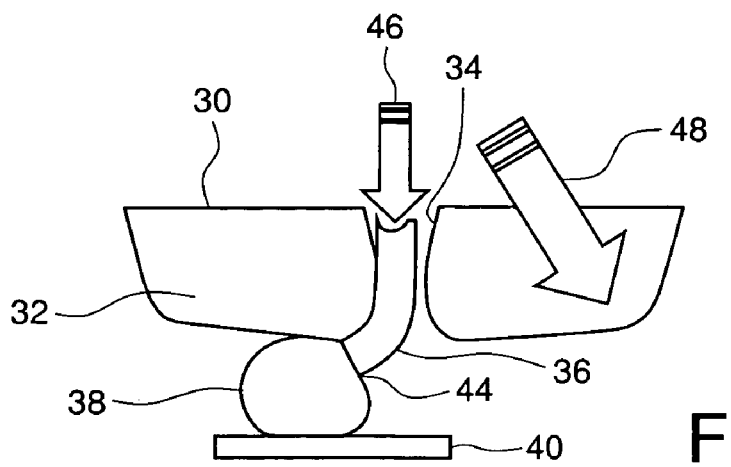
Figure 3C:
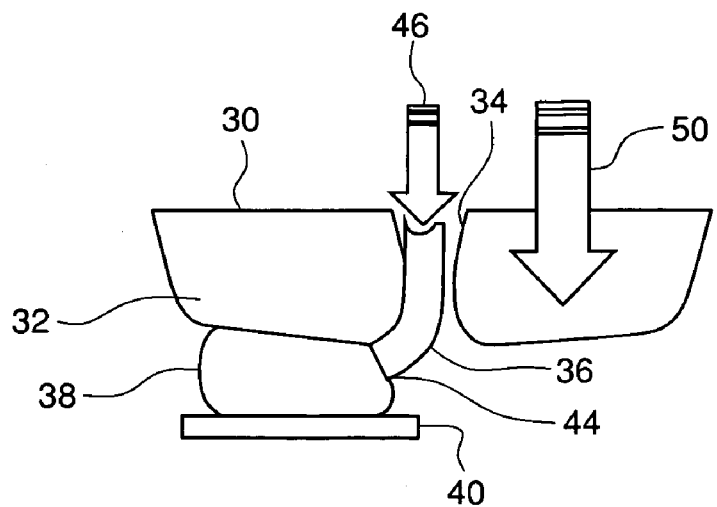

Referring to the drawings, where like numerals identify like elements, there is illustrated in FIGS. 3A through 3C a ball bonding process according to an exemplary embodiment of the present invention. As described below, the ball bonding process of the present invention provides a bonded wire loop that extends to a height from the underlying substrate to which it is bonded that is reduced compared to that of wire loops formed by prior ball bonding processes.

Referring to FIG. 3A, a ball bonding apparatus includes a bonding tool 30 (e.g., a capillary 30) having working tip 32. To facilitate illustration of the invention, only working tip 32 of capillary 30 is shown. Capillary 30 defines central passage 34 that extends through capillary 30 and that receives wire 36 for bonding by the ball bonding apparatus. In a known manner, substantially spherical ball 38 is formed from a terminal end portion of wire 36 that extends from capillary 30 beyond working tip 32. Preferably, the ball bonding apparatus includes an electronic flame-off (EFO) wand (not shown) that generates a spark to melt the metal of wire 36 and form ball 38 at the end of wire 36.

Capillary 30 is directed (in the direction indicated by arrow 46 in FIG. 3A) by the ball bonding apparatus towards a bonding location (e.g., a contact pad of a substrate, a contact pad of a semiconductor die, etc.) until ball 38 touches first contact 40. As indicated by arrow 42 in FIG. 3A, capillary 30 is then directed along an oblique pathway (i.e., in an angular direction) with respect to the surface of first contact 40 such that a rolling motion is applied to ball 38. This contrasts with motion of conventional wire bonding processes where the movement of the capillary after the first ball is placed is generally perpendicular to the initial contact surface. As a result of the rolling motion that is imparted to ball 38, junction 44 between wire 36 and ball 38 is relocated from the top of ball 38 to a location along the side of ball 38.

According to certain exemplary embodiments of the present invention, the ball bonding apparatus includes a clamp that, similar to the clamps of prior ball bonding apparatuses, prevents relative movement between capillary 30 and wire 36 when the clamp is in a closed condition. As indicated in FIGS. 3A–3C by arrow 46, the clamp of the ball bonding apparatus is maintained in an opened condition as ball 38 is rolled by the obliquely moving capillary 30.

Referring to FIG. 3B, as junction 44 between wire 36 and ball 38 is relocated from the top of ball 38 by the obliquely moving capillary 30, the path of capillary 30 may be changed. As indicated by arrow 48 in FIG. 3B, the vertical component of the movement of capillary 30 is increased. As shown in FIG. 3B, the increasingly vertical movement of capillary 30, and the corresponding reduction in the distance between working tip 32 and first contact 40, results in flattening of ball 38. As also shown in FIG. 3B, there is still a horizontal component to the movement of capillary 30 further rolling ball 38 and relocating junction 44 between wire 36 and ball 38 away from a top location such that junction 44 is located along a side of ball 38. As indicated by arrow 46, the clamp of the ball bonding apparatus preferably remains in an opened condition permitting relative movement between wire 36 and capillary 30.

Referring to FIG. 3C, with ball 38 rolled such that junction 44 has been relocated substantially to the side of ball 38, capillary 30 is preferably moved towards first contact 40 along a path that is substantially vertical (i.e., perpendicular to the surface of first contact 40 as indicated by arrow 50) to apply a compressive force to ball 38. As shown in FIG. 3C, the compressive force results in further flattening of ball 38. For example, heat and vibration may be applied by the ball bonding apparatus to facilitate bonding between ball 38 and first contact 40. It should be readily apparent that depending on the degree of vertical movement provided during the step shown in FIG. 3B, the movement of capillary 30 shown in FIG. 3C may be eliminated.

Referring to FIG. 4, capillary 30 is then moved to second bond location 52 with the clamp in the opened condition such that wire 36 is fed from working tip 32 of capillary 30. Force, heat and vibration are then applied by the ball bonding apparatus to bond wire 36 to second bond location 52 and form wire loop 54. Wire 36 of wire loop 54 extends to height 56 with respect to the surface of first contact 40 to which ball 38 is bonded. Because the above-described rolling of ball 38 locates junction 44 on the side of ball 38, instead of the top of the ball, height 56 is less than that of prior wire loops in which the wire extends upwardly from the top of the ball.

Figure 5A:
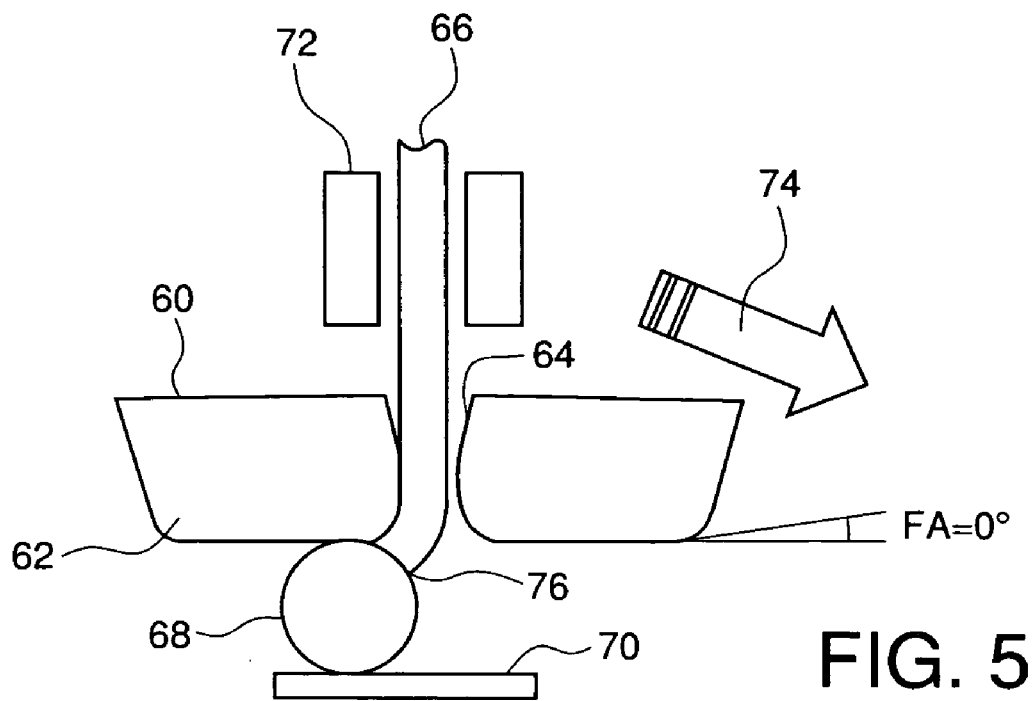
FIGS. 5A through 5C are schematic illustrations of a ball bonding process according to an exemplary embodiment of the present invention.
Figure 5B:
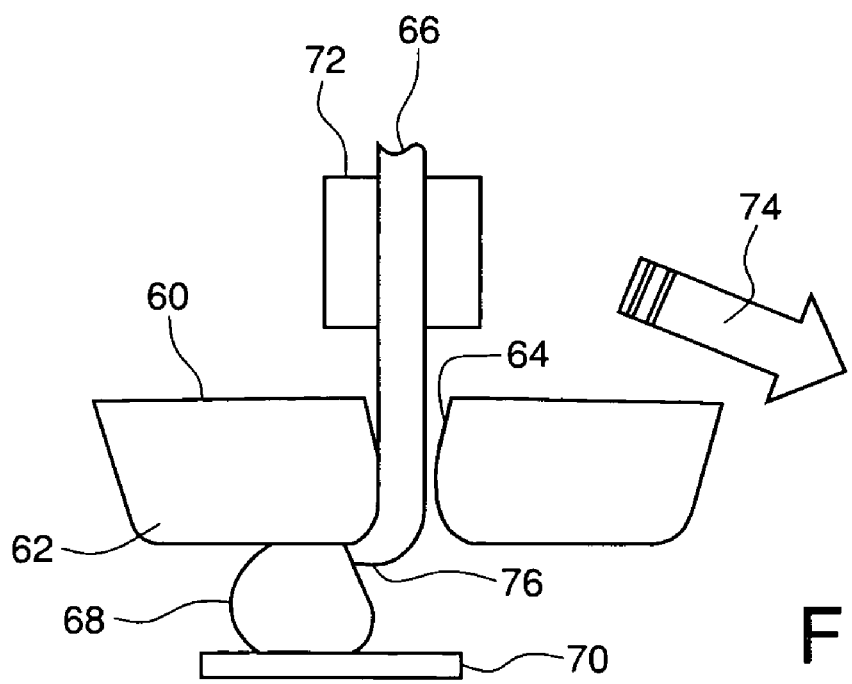
Figure 5C:
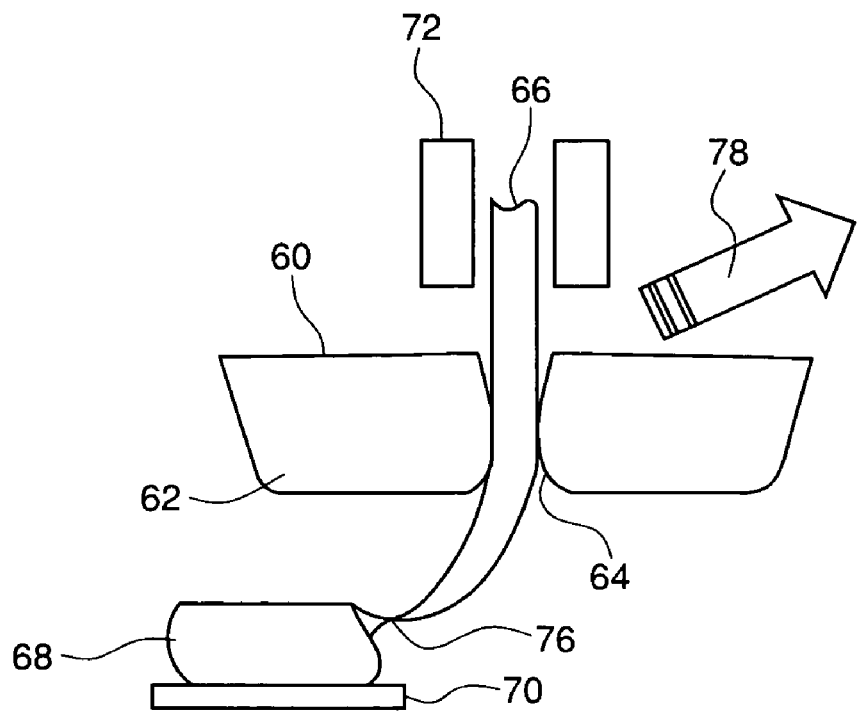

Referring to FIGS. 5A through 5C, there is illustrated a ball bonding process according to the invention for forming a bump (e.g., a flat-top bump). Flat-top bumps may also be referred to in the art as "flip-chip connections." Ball bump flip-chip connections are used, instead of wire connections, in applications where demands for smaller packaging, such as in the cellular telephone market, may rely on increased density of the bond connections. In addition to compactness in design, flip-chip connections may also provide improved electrical performance through reduced interconnect length.

Similar to the above-described ball bonding apparatus of FIGS. 3A through 3C, the ball bump apparatus of FIGS. 5A through 5C includes capillary 60 having working tip 62 and central passage 64 receiving wire 66. As shown, working tip 62 differs from working tip 32 of FIGS. 3A through 3C in that working tip 62 has a face angle substantially equal to zero.

Referring to FIG. 5A, substantially spherical ball 68 is formed from an end portion of wire 66 extending from working tip 62. Capillary 60 is directed by the ball bonding apparatus towards bonding location 70 (e.g., a contact 70 on a substrate) until ball 68 touches contact 70. With clamp 72 in an opened condition, capillary 60 is directed along an oblique or angular pathway with respect to the surface of contact 70, shown by arrow 74, imparting a rolling motion to ball 68. Similar to the above-described ball bonding process, the rolling motion of ball 68 provided by the oblique motion of capillary 60 relocates junction 76 between wire 66 and ball 68 from the top of ball 68 to the side of ball 68.

Referring to FIG. 5B, clamp 72 is closed to prevent relative movement between capillary 60 and wire 66. Capillary 60 continues to be moved along oblique path 74 with clamp 72 held in the closed condition. This differs from the above-described ball bonding process in which, as shown in FIG. 3B, the clamp is maintained in an opened condition and the angle of the capillary is changed to increase the vertical component of movement with respect to the contact surface. As shown in FIG. 5B, the vertical component of capillary movement along path 74 results in flattening of ball 68. As also shown, the horizontal component of capillary movement along path 74 with clamp 72 held in the closed condition results in reduction in the diameter of wire 66 at junction 76. For example, heat and vibration may be applied to ball 68 as it is being flattened under pressure by capillary 60 to facilitate bonding between ball 68 and contact 70.

Referring to FIG. 5C, clamp 72 is opened after ball 68 has been bonded to contact 70 and wire 66 has been reduced in diameter at junction 76. Capillary 60 is then moved away from contact 70 a short distance along upwardly extending pathway 78. As shown, the reduced diameter of wire 66 at junction 76 remains sufficiently intact for a short length of wire 66 to be fed from working tip 62 of capillary 60. As shown in FIG. 5C, however, the horizontal component of the capillary movement along path 78 results in further reduction in the diameter of wire 66 at junction 76 until separation occurs between wire 66 and ball 68.

Figure 6:
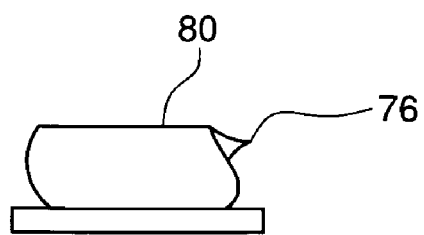
FIG. 6 is a rolled bump formed by the process of FIGS. 5A through 5C.

Referring to FIG. 6, an exemplary flat-top bump 80 that results from separation between wire 66 and bonded ball 68 is shown. The above-described rolled ball process for forming ball bump 80 provides a simplified process compared to prior ball bump processes. In prior processes, the ball is flattened under pressure applied by a vertically moving capillary and bonded to a substrate surface using heat and vibration. Because of the vertical pathway of the capillary (i.e., no horizontal rolling component to the capillary movement), the junction between the wire and the bonded ball remains at the top of the ball following bonding of the ball. Following separation between the wire and the bonded ball, by upwardly moving the capillary when the clamp is held in its closed condition for example, leaves a peak at the top of the ball that includes the wire junction. In order to provide a flat-top ball bump, conventional processes may utilize a further step known as "coining" which involves applying force to the top of the bonded ball to flatten the peak into a smooth surface.

The rolling of the ball during the bonding step of the ball bump process of the present invention relocates the wire junction at the side of bonded ball 68. Furthermore, by providing working tip 62 of capillary 60 with a face angle substantially equal to zero, working tip 62 forms the top of bonded ball 68 into a smooth, flat, surface. Therefore, the ball bump process of the present invention may eliminate the subsequent "coining" of bonded ball 68.

While the present invention has been described primarily with respect to a ball-shaped or spherical conductive bumps being deposited, it is understood that the conductive bumps are not limited to any particular size, shape, or configuration.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of forming a conductive bump, the method comprising the steps of:
   depositing a conductive bump on a bonding location using a bonding tool such that a junction exists between (1) a length wire extending at least partially within the bonding tool and (2) the deposited conductive bump, the depositing step including lowering the bonding tool such that the conductive bump is deposited on the bonding location; and
   moving the bonding tool to contact the conductive bump such that a location of the junction is moved with respect to the bonding location, the moving step including moving the bonding tool to contact the conductive bump after the depositing step, where the bonding tool is not raised between the depositing step and the moving step.

2. The method of claim 1 wherein the moving step includes moving the bonding tool at an oblique angle with respect to the bonding location.

3. The method of claim 1 wherein the moving step includes at least partially flattening the deposited conductive bump such that a height profile of the conductive bump is decreased.

4. The method of claim 1 wherein the moving step includes at least partially flattening the deposited conductive bump such that a top surface is substantially flat.

5. The method of claim 1 wherein the moving step includes at least partially flattening the deposited conductive bump with the bonding tool, where the bonding tool has a face angle of substantially zero degrees.

6. The method of claim 1 further comprising separating conductive bump from the length of wire.

7. The method of claim 6 wherein the separating step includes moving the bonding tool away from the conductive bump, with a clamp engaged with the bonding tool in a closed position, to separate the conductive bump from the length of wire.

8. The method of claim 1 further comprising (a) moving the bonding tool towards a second bonding location while paying out wire through the bonding tool, and (b) forming a wire bond at the second bonding location after step (a), such that a wire loop extends between the bonding location and the second bonding location.

9. A method of forming a conductive bump, the method comprising the steps of:
   depositing a conductive bump on a bonding location using a bonding tool such that a junction exists between (1) a length wire extending at least partially within the bonding tool and (2) the deposited conductive bump; and
   moving the bonding tool to contact the conductive bump such that a location of the junction is moved with respect to the bonding location, wherein the moving step includes moving the junction from (a) an area at an upper portion of the conductive bump with respect to the bonding location to (b) an area at a side portion of the conductive bump with respect to the bonding location, where the bonding tool is not raised between the depositing step and the moving step.

10. The method of claim 1 wherein the moving step includes (a) moving the bonding tool, while in contact with the deposited conductive bump, at an angle extending downward and away from the conductive bump.

11. The method of claim 10 wherein after step (a) the moving step also includes (b) further moving the bonding tool, while still in contact with the deposited conductive bump, at a different angle extending downward and away from the conductive bump.

12. The method of claim 11 wherein after step (b) the moving step also includes (c) further moving the bonding tool, while still in contact with the deposited conductive bump, in substantially downward direction.

13. A method of forming a wire loop extending between a first bonding location and a second bonding location, the method comprising the steps of:
   (a) depositing a conductive bump on a first bonding location using a bonding tool such that a junction exists between (1) a length of wire extending at least partially within the bonding tool and (2) the deposited conductive bump, the depositing step including lowering the bonding tool such that the conductive bump is deposited on the first bonding location;
   (b) moving the bonding tool to contact the conductive bump after step (a) such that a location of the junction is moved with respect to the bonding location, where the bonding tool is not raised between step (a) and step (b);
   (c) moving the bonding tool towards a second bonding location while paying out wire through the bonding tool; and
   (d) forming a wire bond at the second bonding location, such that a wire loop extends between the first bonding location and the second bonding location.

14. The method of claim 13 wherein step (b) includes moving the bonding tool at an oblique angle with respect to the bonding location.

15. The method of claim 13 wherein step (b) includes at least partially flattening the deposited conductive bump such that a height profile of the conductive bump is decreased.

16. The method of claim 13 wherein step (b) includes at least partially flattening the deposited conductive bump such that a top surface is substantially flat.

17. A method of forming a wire loop extending between a first bonding location and a second bonding location, the method comprising the steps of:
(a) depositing a conductive bump on a first bonding location using a bonding tool such that a junction exists between (1) a length of wire extending at least partially within the bonding tool and (2) the deposited conductive bump;
(b) moving the bonding tool to contact the conductive bump such that a location of the junction is moved with respect to the bonding location;
(c) moving the bonding tool towards a second bonding location while paying out wire through the bonding tool; and
(d) forming a wire bond at the second bonding location, such that a wire loop extends between the first bonding location and the second bonding location, wherein step (b) includes moving the junction from (1) an area at an upper portion of conductive bump with respect to the first bonding location to (2) an area at a side portion of the conductive bump with respect to the first bonding location.

18. The method of claim 13 wherein the moving step includes (1) moving the bonding tool, while in contact with the deposited conductive bump, at an angle extending downward and away from the conducive bump.

19. The method of claim 18 wherein after step (1) the moving step also includes (2) further moving the bonding tool, while still in contact with the deposited conductive bump, at a different angle extending downward and away from the conductive bump.

20. The method of claim 19 wherein after step (2) the moving step also includes (3) further moving the bonding tool, while still in contact with the deposited conductive bump, in a substantially downward direction.

* * * * *